United States Patent
Gambino et al.

[11] Patent Number: 5,879,985
[45] Date of Patent: Mar. 9, 1999

[54] CROWN CAPACITOR USING A TAPERED ETCH OF A DAMASCENE LOWER ELECTRODE

[75] Inventors: Jeffrey P. Gambino, Gaylordsville, Conn.; David E. Kotecki, Hopewell Junction, N.Y.

[73] Assignee: International Business Machines Corporation, Armonk, N.Y.

[21] Appl. No.: 827,339

[22] Filed: Mar. 26, 1997

[51] Int. Cl.$^6$ .................................................. H01L 21/8242
[52] U.S. Cl. ........................... 438/253; 438/240; 438/396
[58] Field of Search ................... 438/238–239, 438/253–256, 381, 396–399

[56] References Cited

U.S. PATENT DOCUMENTS

| | | | |
|---|---|---|---|
| 5,235,199 | 8/1993 | Hamamoto et al. | 257/306 |
| 5,354,716 | 10/1994 | Pors et al. | 437/52 |
| 5,432,116 | 7/1995 | Keum et al. | 437/60 |
| 5,451,539 | 9/1995 | Ryou | 437/60 |
| 5,550,076 | 8/1996 | Chen | 437/52 |
| 5,552,334 | 9/1996 | Tseng | 437/52 |
| 5,561,311 | 10/1996 | Hamamoto et al. | 257/309 |
| 5,759,888 | 6/1998 | Wang et al. | 438/239 |

FOREIGN PATENT DOCUMENTS

| | | |
|---|---|---|
| 6-224385 | 8/1994 | Japan . |
| 7045718 | 2/1995 | Japan . |

OTHER PUBLICATIONS

Toru Kaga, et al. Crown–Shaped Stacked–Capacitor Cell for 1.5–V Operation 64–Mb DRAM's., *IEEE Transactions on Electron Devices*, vol. 38, No. 2, Feb. 1991, pp. 255–260.

*Primary Examiner*—Joni Chang
*Attorney, Agent, or Firm*—Scully, Scott, Murphy & Presser; Jay H. Anderson

[57] ABSTRACT

A structure and process for fabricating a crown capacitor using a tapered etch and chemical mechanical polishing to form a bottom electrode having an increased area and crown is provided. The tapered etch is used to form a trough in an interlevel dielectric, e.g. $SiO_2$, and is performed over contact hole forming a crown-like structure. The trough and, optionally, the crown are then covered by a conductor, which is patterned by chemical mechanical polishing.

19 Claims, 5 Drawing Sheets

CROWN CAPACITOR USING A TAPERED ETCH OF A DAMASCENE LOWER ELECTRODE

DESCRIPTION

1. Field of the Invention

The present invention relates to a process for fabricating a crown capacitor using steps which include tapered etching and chemical mechanical polishing to form a bottom electrode and a crown-like structure in the capacitor. No side wall spacers, as required in prior art processes, are utilized in the process of the present invention.

In accordance with the present invention, a tapered etch is used to form a trough in a planarized interlevel dielectric material, e.g. doped $SiO_2$, of a semiconductor structure and is performed over a contact hole forming a "crown-like structure." The contact hole and, optionally, the crown are then covered by a conductor material, which is patterned by chemical mechanical polishing to form the bottom electrode of the capacitor. The process of the present invention is simple, requiring no additional processing steps or side wall spacers as required by prior art processes, and it provides a nearly planar surface after formation of the plate electrode.

A crown capacitor structure containing a damascene bottom electrode is also provided by the present invention. It is emphasized that the crown capacitor structure of the present invention has an increased electrode area compared to conventional stacked capacitors. Moreover, the crown capacitors of the present invention have a nearly planar topography which eliminates the need for extra processing steps that are typically required in the prior art to fabricate crown capacitors having a planarized surface.

2. Prior Art

Generally, a semiconductor memory device such as a dynamic random access memory (DRAM) cell comprises a plurality of memory cells which are used to store a large quantity of information. Each memory cell includes a capacitor for storing electric charge and a field effect transistor for opening and closing charge and discharge passages of the capacitor. The number of bits on DRAM chips has been increasing by approximately 4×every three years; this has been achieved by reducing the cell size. Unfortunately, the smaller cell size also results in less area to fabricate the capacitor.

In early DRAM generations, the storage electrode of each capacitor which constitutes each memory cell, together with each corresponding field effect transistor, was formed in the shape of a planar plate over the field effect transistor. Because of this planar plate shape, the storage electrode surface area was abruptly reduced as the cell size decreased. In this regard, conventional methods for fabricating memory cells have difficulties in increasing the surface area of storage electrodes because they involve the formation of a storage electrode having a planar plate shape.

In order to increase the electrode area and hence capacitance of DRAM cells, stacked capacitors, such as described in Japanese Patent No. 07-45718 and Japanese Patent No. 06-224385, and crown capacitors, such as described in T. Kaga, et al., IEEE Trans. Elec. Dev., Vol. 38, 1991, p. 255 and U.S. Pat. No. 5,552,234 to Tseng, have been employed.

Figure 1:
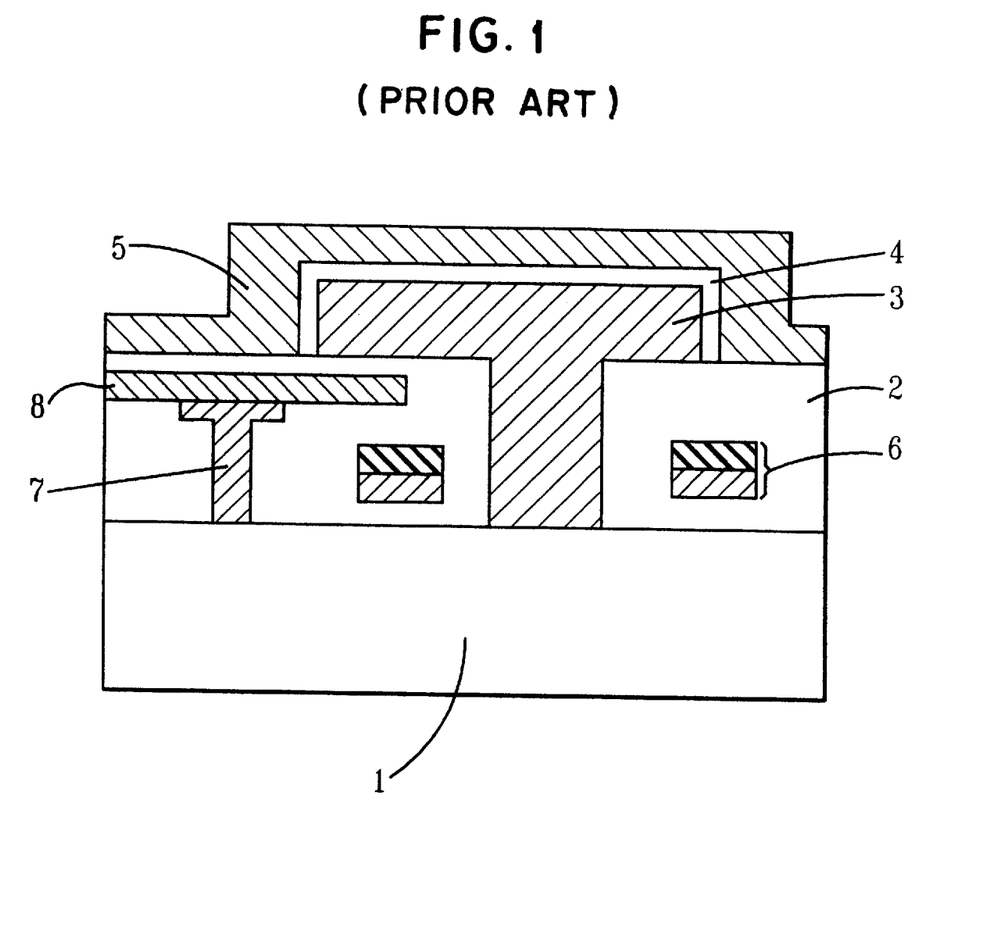
FIG. 1 is a cross-sectional view of a prior art stacked capacitor prepared by conventional methods.

Conventional stack capacitors provide increased electrode area using simple processing steps including deposition and etching of a bottom electrode. A conventional stacked capacitor prepared from prior art processes is shown in FIG. 1. Specifically, FIG. 1 shows a semiconductor substrate 1, a dielectric material 2 formed on the surface of semiconductor substrate 1, a bottom electrode 3, a node dielectric material 4 and a plate electrode 5. The dielectric material 2 contains wordline 6, bitline 8 and bitline contact 7. Due to the additional area provided by the sidewalls of the bottom electrode, this conventional stacked capacitor has an increased surface area compared to planar capacitors.

However, for a given dielectric material, the only way to increase the area of the conventional stack capacitor is to make the bottom electrode taller, which introduces severe topography between the array and the support circuits. This severe topography reduces the process window for lithography and may require an additional chemical mechanical polishing step to replanarize the surface. Moreover, as the height of stack capacitor increases, the planarization step becomes increasingly expensive.

For a given stacked capacitor height, crown capacitors can provide more electrode area (80% or more) than simple stacked capacitors. Despite this increase in electrode area, prior art crown capacitors require additional processing steps which subsequently add to the cost of their manufacturing. For instance, in a process which forms a single crown, as disclosed in the Kaga, et al. reference mentioned above, at least five additional processing steps are required. These additional processing steps include: mandrel oxide deposition and etch, plug oxide deposition and etch, and mandrel oxide/plug oxide removal. In addition, topography (though less than that of conventional stacked capacitors) is still created by the crowns, which may add extra planarization steps in their fabrication.

In view of the drawbacks mentioned hereinabove concerning conventional stacked capacitors and conventional crown capacitors, there is a need to develop new processes which provide increased electrode area and a nearly planar topography to a capacitor without requiring a lot of extra processing steps.

SUMMARY OF THE INVENTION

One object of the present invention is to provide a process for fabricating a crown capacitor containing a damascene bottom electrode which has an increased area as compared to conventional stack capacitors without using side wall spacers.

Another object of the present invention is to provide a process for fabricating a crown capacitor which has nearly the equivalent electrode area as standard crown capacitors, but does not require the use of extra processing steps, as compared to conventional processes for fabricating crown capacitors.

A further object of the present invention is to provide a process that directly results in a planarized topography so as to eliminate the need for using additional processing steps which are typically required in prior art processes of fabricating crown capacitors or stacked capacitors.

These as well as other objects are achieved by the present invention which utilizes steps including a tapered etch and chemical mechanical polishing to form the bottom electrode and the crown.

Specifically, in one embodiment of the present invention, a process for fabricating a crown capacitor containing a damascene bottom electrode is provided which comprises the steps of:

(a) providing a semiconductor structure comprising a semiconductor substrate having appropriate diffusion and isolation regions, at least one wordline, at least one bitline, at least one bitline contact for connecting said bitline to said semiconductor substrate, and a planarized interlevel dielectric material, wherein said interlevel dielectric material is on top of said planarized semiconductor substrate and surrounds said bitline, bitline contact and wordline;

(b) forming a contact hole in said planarized interlevel dielectric material between said wordlines to expose an area of said semiconductor substrate;

(c) forming a trough in said planarized interlevel dielectric material at said contact hole, wherein said trough does not extend all the way through said contact hole;

(d) depositing a bottom electrode material into said contact hole and said trough, wherein said bottom electrode material comprises a conductor;

(e) patterning the bottom electrode material provided in step (d) by chemical mechanical polishing;

(f) depositing a node dielectric material on said patterned bottom electrode material and on said planarized interlevel dielectric material;

(g) optionally, subjecting the structure provided in step (f) to thermal oxidation under conditions effective to diffuse oxygen into said node dielectric material; and (h) depositing a plate electrode on said node dielectric material or said thermally oxidized node dielectric material.

It is emphasized that in step (c) of the present invention, a "crown" or "crown-like" structure surrounding the contact hole is formed. The term "crown" or "crown-like" is used herein to denote a structure which has the shape of the letter "w", i.e. the middle peak is tapered, typically from about 80 to about 88 degrees, to the valley. It is noted that this tapering may be provided by step (c) or step (b) of the present invention. The top of the crown may also be recessed, if desired.

Another aspect of the present invention relates to a crown capacitor which is prepared using the process of the present invention. Thus, the crown capacitor of the instant invention contains a damascene bottom electrode which has a larger surface area than conventional stack capacitors.

DETAILED DESCRIPTION OF THE INVENTION

The present invention will now be described in detail with reference to the accompanying drawings, wherein like reference numerals are used for like and corresponding elements of the drawings. Specifically, the present invention provides a process for fabricating a crown capacitor without the need of any side wall spacers or additional processing steps that are typically required by prior art processes to obtain a planarized structure.

Figure 2A:
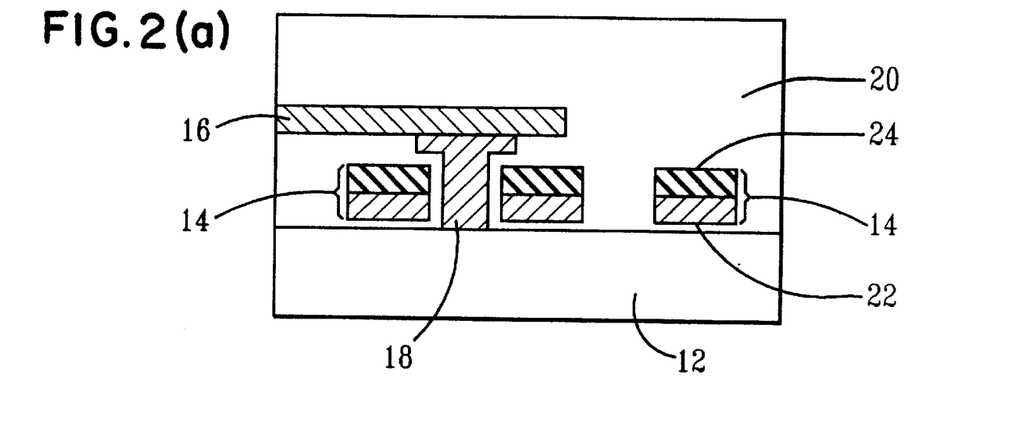
FIGS. 2(a)–(e) are cross-sectional views of a crown capacitor containing a doped polysilicon bottom electrode which is fabricated in accordance with the various processing steps of the present invention.

Referring first to FIG. 2(a), there is shown a semiconductor structure which is employed in the present invention for fabricating the crown capacitors. Specifically, in accordance with the present invention, a semiconductor structure is provided which comprises a semiconductor substrate 12, at least one wordline 14, at least one bitline 16, at least one bitline contact 18 connecting bitline 16 to semiconductor substrate 12, and a planarized interlevel dielectric material 20 which is on top of semiconductor substrate 12 and surrounds wordline 14, bitline 16 and bitline contact 18. Methods of fabricating such a semiconductor structure are well known to those skilled in the art and thus will not be discussed in detail herein. For example, see the T. Kaga et al. reference mentioned hereinabove, the contents of which are incorporated herein by reference.

The semiconductor substrate 12 contains appropriate diffusion and isolation regions which are embedded in substrate 12. For clarity, these regions as well as others are not shown in the drawings of the present invention. The semiconductor substrates that may be employed in the present invention include, but are not limited to, silicon, SiGe or GaAs. Of these semiconductor substrates, silicon is most highly preferred in the present invention.

The semiconductor substrates employed in the present invention can be of the p-type or the n-type depending upon the type of crown capacitor being manufactured. The semiconductor substrates can be manufactured using techniques well known to those skilled in the art.

As is known to those skilled in the art, bitline 16 is connected to a diffusion region by bitline contact 18. The bitline contacts employed in the present invention are composed of conventional conductive materials including, but not limited to, polysilicon, suicides and metals such as W, Cr, Al, Cu, Ti, TiN and the like. Of these conductive materials, bitline contact 18 is typically composed of polysilicon.

Wordline 14 contains a base 22 composed of conductive material, such as polysilicon, and a layer 24 composed of a conventional insulating material such as $Si_3N_4$ on top of said base.

The planarized interlevel dielectric materials employed in the present invention include, but are not limited to, $SiO_2$, B- and/or P-doped $SiO_2$, metal oxides, such as $TiO_2$, $Ta_2O_5$, $(Ba,Sr)TiO_3$ and the like, and mixtures thereof. These dielectric materials may be grown, deposited or reacted by using techniques well known to those skilled in the art. Of the interlevel dielectric materials mentioned herein, B- and/or P-doped $SiO_2$ is highly preferred.

Figure 2B:
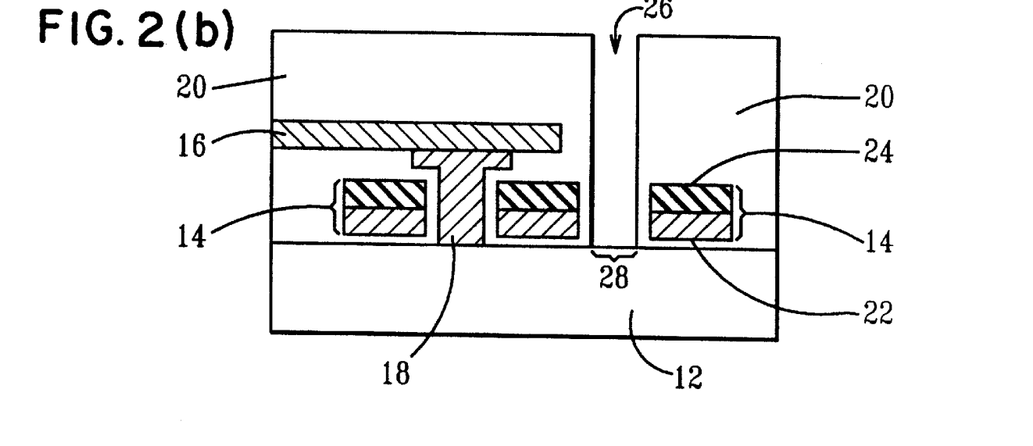
Figure 2C:
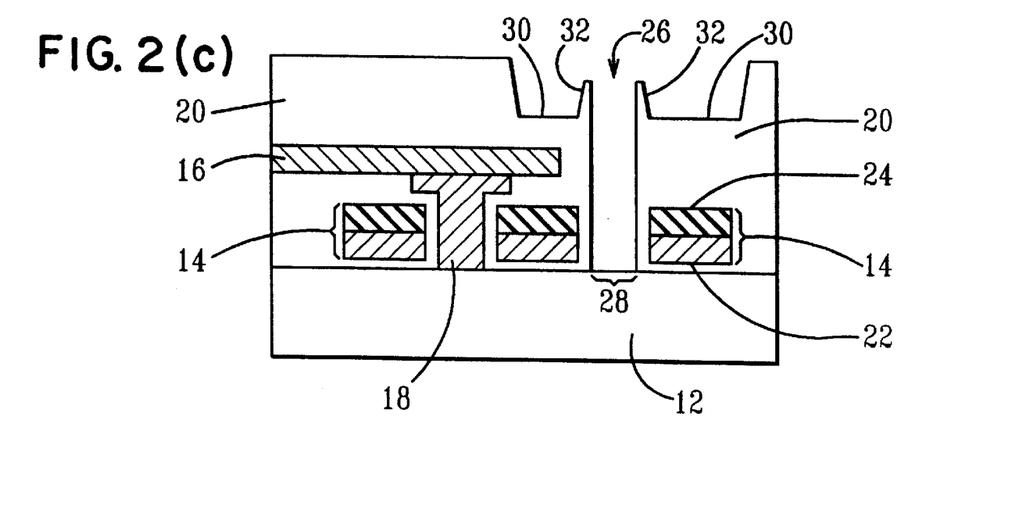

In accordance with the next step of the present process, which is shown in FIG. 2(b), a contact hole 26 is formed in interlevel dielectric material 20 between wordlines 14 to expose an area 28 of said semiconductor substrate 12. Contact hole 26 is formed by patterning interlevel dielectric material 20 using standard lithographic techniques and an anisotropic etching technique that etches the interlevel dielectric material with a high selectivity compared to the semiconductor substrate. For example, when the dielectric material is $SiO_2$ and when the semiconductor substrate is composed of silicon, the anisotropic etching technique must have a selectivity to etch $SiO_2$ of at least 10:1. Suitable anisotropic etching techniques that may be employed in forming contact hole 26 are ion beam etching (IBE), reactive ion etching (RIE), plasma etching or laser ablation. Each of the aforementioned anisotropic etching techniques are well known to those skilled in the art. Of the above mentioned anisotropic etching techniques, RIE is most preferably employed in the present invention to form contact hole 26. Contact hole 26 can be normal, i.e. perpendicular, to the plane of interlevel dielectric layer 20 or, in an alternative embodiment of the present invention, it may have some taper to it. When the contact hole is tapered, the tapering is typically from about 75 to about 89 degrees. This embodiment of the present invention is shown in FIGS. 2(b)' and 2(c)'.

In the next step of the present invention, which is shown in FIG. 2(c), a trough 30 is formed in interlevel dielectric material 20 by using standard lithography and one of the above mentioned anisotropic etching techniques. When contact hole 26 is not tapered, the anisotropic etching technique employed in this step of the present invention should produce some tapering 32 in the trough. Ideally the tapered etch should provide an angle of from about 75 to about 89 degrees in the interlevel dielectric material which provides a "crown" or "crown-like" structure surrounding contact hole 26. When contact hole 26 is tapered, it is not necessary to taper the trough; see FIG. 2(c)' in this regard.

Typically, RIE is employed in this step of the present invention which results in increasing the electrode area. The etching depth of this step of the present invention depends on the desired capacitance of the capacitor, but it typically is from about 100 to about 10,000 nm. More preferably, the etching depth is about 200 nm. It should be noted that the thickness of interlevel dielectric material 20 above bitline 16 must be greater than the depth of trough 30 to ensure that bitline 16 is isolated from the capacitor.

One type of RIE that may be employed in forming taper 32 is a polymerizing etch which involves patterning the interlevel dielectric material using an etchant gas that contains carbon and fluorine, e.g. $CHF_3$ or $C_4F_8$.

In one embodiment of the present invention, the top of the crown may be recessed, if necessary, using a brief isotropic etch with either a wet etch or a dry etch. The etch time is selected to provide a recess ranging from about 10 to about 500 nm. More preferably, the etching time provides a recess of about 100 nm. This embodiment of the present invention is not shown in the drawings.

When wet etching is employed in the present invention to provide the recessed surface, the chemical etchant is selected from the group consisting of $H_2O_2$, chromic acid, phosphoric acid, acetic acid, HF and the like. Mixtures of these chemical etchants alone or with water are also contemplated herein. The chemical etchant may also be buffered to a desired pH using known buffering agents. Of the chemical etchants mentioned herein above, dilute or buffered HF is highly preferred.

When dry etching is employed to provide the recess in the top of the crown, chemical dry etching using $CF_4$ gas is typically employed.

Figure 2D:
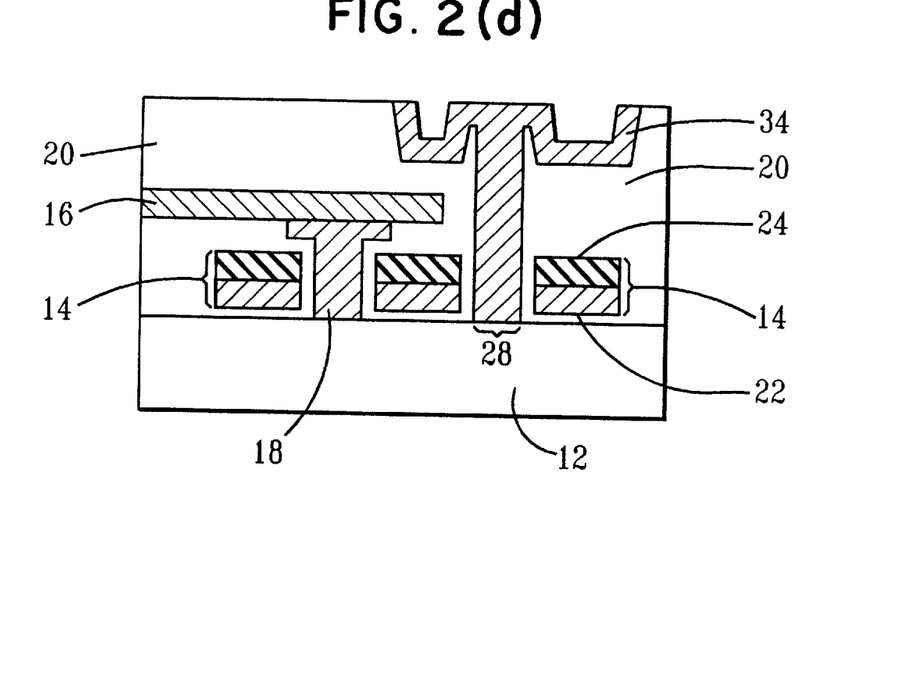

The next step of the present invention is shown in FIG. 2(d). In accordance with this step of the present invention, a conductor material 34 which forms the bottom electrode of the capacitor of the present invention is deposited into the contact hole and into the trough and thereafter patterned by chemical mechanical polishing. Suitable conductors that may be deposited in forming the bottom electrode include, but are not limited to, doped polysilicon, TiN, TiAlN, TaSiN, and silicides such as $WSi_2$, $CoSi_2$ and the like. Polysilicon conductors are doped with a n-doping agent which includes P, As or Sb, or a p-doping agent such as B. Of these materials, polysilicon doped with As or P is highly preferred in the present invention.

The conductor which forms the bottom electrode is deposited by using deposition techniques well known to those skilled in the art. A highly preferred deposition technique employed in the present invention is Low Pressure Chemical Vapor Deposition (LPCVD) which is conducted at pressures ranging from about 10 to about 80 Pa for a period of time of from about 5 to about 60 minutes.

Under the above deposition conditions a continuous layer of conductor is formed having a thickness of from about 20 to about 500 nm. More preferably, the LPCVD process provides a layer of conductor that has a thickness of about 100 nm.

After depositing the conductor material, the deposited conductor is subjected to chemical mechanical polishing which technique is well known in the art for planarizing the surface of a semiconductor device. Such a process, for example, is described in U.S. Pat. No. 5,246,884 to Jaso, et al., the contents of which are incorporated herein by reference.

Figure 2E:
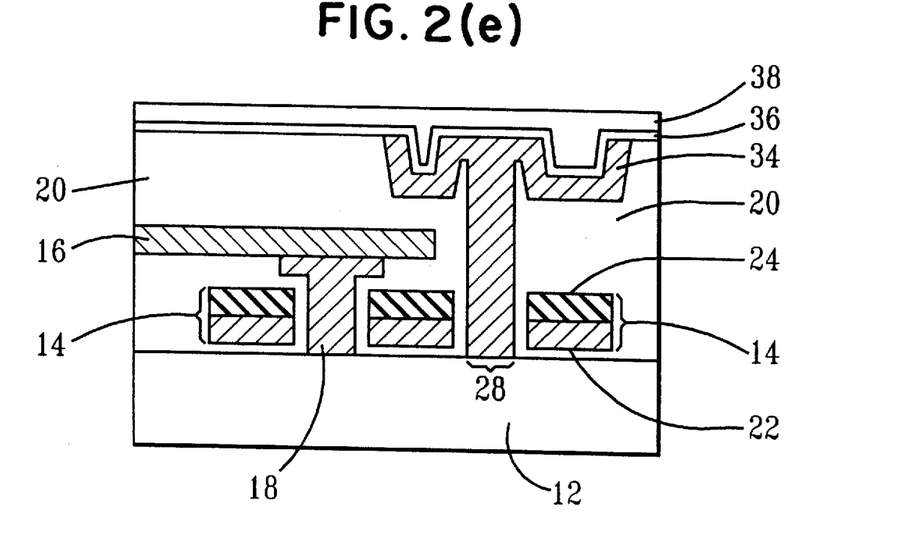

After planarizing bottom electrode 34, a node dielectric material 36 is deposited on the surface of bottom electrode 34 and interlevel dielectric material 20, and then, optionally, subjected to an oxidation process under conditions which are sufficient to diffuse oxygen into the node dielectric material. It should be noted that this oxidation step does not occur when high dielectric material such as $(Ba,Sr)TiO_3$ are employed. This step of the present invention is shown in FIG. 2(e). Suitable node dielectric materials that may be employed in the instant invention include dielectric materials such as $Si_3N_4$, oxynitrides, $Ta_2O_5$ and $TiO_2$. Of these materials, $Si_3N_4$ is highly preferred in the present invention.

The node dielectric material is deposited using conventional deposition techniques well known to those skilled in the art, with Chemical Vapor Deposition (CVD) deposition conditions, the node dielectric material typically has a thickness of from about 2 to about 15 nm, more preferably 5 nm.

After depositing the node dielectric material, the structure is, optionally, subjected to thermal oxidization at temperatures ranging from about 600° to about 1100° C. for a time period of from about 10 seconds to about 30 minutes which conditions are effective to result in diffusion of oxygen into the node dielectric material. For example, when $Si_3N_4$ is employed as the node dielectric material, the above thermal oxidization conditions results in a $SiO_xN_y$ layer.

Referring again to FIG. 2(e), there is shown a plate electrode 38 which is deposited on the surface of oxidized node dielectric material 36. Suitable plate materials that may be employed in the present invention as the upper electrode include polysilicon, silicides and conductive metals such as W, Cr, Al, Pt, Pd, TiN and the like. Of these materials, polysilicon is highly preferred as the plate material.

The plate electrode is deposited using the above mentioned deposition techniques, e.g. LPVCD, or Physical Vapor Deposition (PVD) under conditions which are sufficient to form a layer having a thickness of from about 50 to about 500 nm. More preferably, the plate material is deposited to a thickness of about 100 nm.

The plate electrode and the node dielectric may then be patterned with a lithography step including RIE of the plate electrode followed by RIE of the node dielectric.

The final crown capacitor structure formed by the present process is shown in FIG. 2(e). It should be noted that the crown capacitor of the present invention may include one or more wiring levels. These additional wiring levels are not however shown in the drawings.

Figure 3:
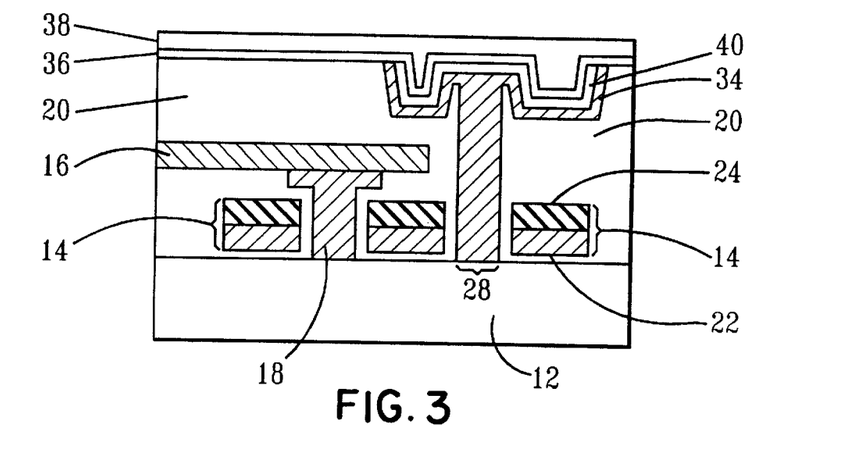
FIG. 3 is a cross-sectional view of a crown capacitor containing a compound electrode.

When high dielectric constant materials are employed in the present invention, such as $(Ba, Sr)TiO_3$, the process shown in FIGS. 2(a)–(e) may be modified as shown in FIG. 3. Specifically, after depositing conductor material 34 into contact hole 26 using the conditions described hereinabove, a noble metal, preferably Ir, is deposited on bottom electrode 34 by PVD. Next, the structure is annealed at temperatures of from about 500° to about 700° C. for a time period of from about 10 seconds to about 30 minutes. These annealing conditions are sufficient to cause reaction between the noble metal and the conductor material forming a compound electrode 40. For example, when polysilicon is employed as the conductor material of the bottom electrode and Ir is employed as the noble metal, the above annealing conditions are sufficient to form $IrSi_2$ in regions where Ir is in contact with polysilicon.

The unreacted noble metal is then removed using a wet etch technique which etches the noble metal at a much higher rate than compound electrode 40. Suitable etchants that may be employed for this purpose include: $HCl:H_2O_2$ or $HNO_3:H_2O$. The final structure is then provided by depositing the node dielectric material 34 on compound electrode 40, optionally, thermally oxidizing the structure, and then depositing a plate electrode 36 on the structure, using the procedures described hereinabove.

Figure 4:
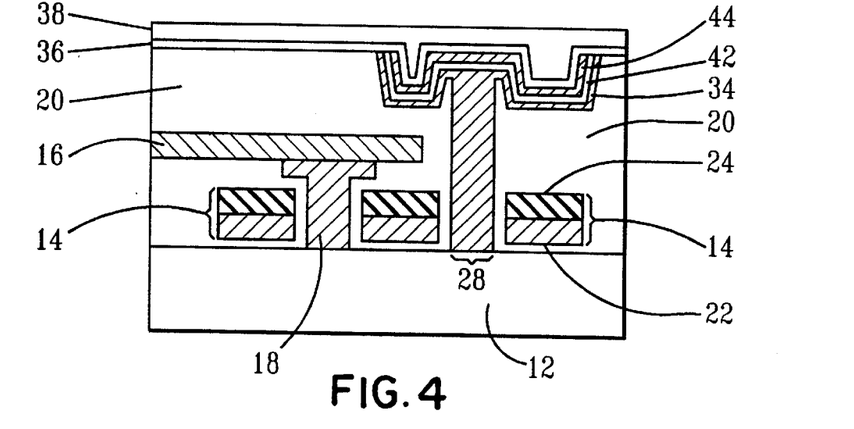
FIG. 4 is a cross-sectional view of a crown capacitor containing a composite bottom electrode fabricated by chemical mechanical polishing using the various processing steps of the present invention.
Figure 5:
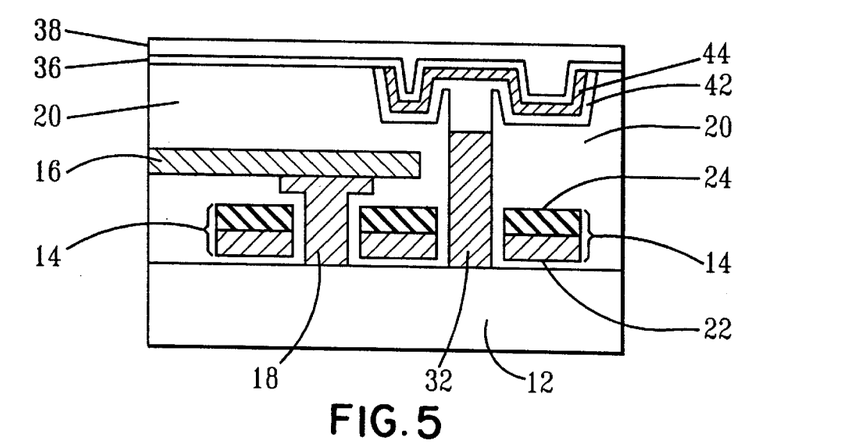
FIG. 5 is a cross-sectional view of a crown capacitor containing a bottom electrode fabricated by chemical mechanical polishing and Si contact fabricated by chemical dry etching.

Other embodiments of the present invention are shown in FIGS. 4 and 5. These embodiments are also applicable when high dielectric materials are also employed and they comprise multiple conductor layers, a material to contact Si and/or an optional barrier layer material, and an electrode material. Specifically, FIG. 4 represents a cross-sectional view of a crown capacitor containing a composite bottom electrode fabricating by chemical mechanical polishing, whereas FIG. 5 represents a crown capacitor containing a composite bottom electrode fabricated by chemical mechanical polishing and a Si contact fabricated by chemical dry etch. The fabrication of the crown capacitors shown in FIGS. 4 and 5 are described hereinbelow. After partially or fully depositing conductor material 32 in the contact hole and optionally the trough, the deposited conductor material 32 is then patterned by methods well known in the art. Specifically, the conductor material 32 in FIG. 4 is patterned by chemical mechanical polishing whereas the conductor material in FIG. 5, which is partially deposited into contact hole 26 only, is patterned by chemical dry etching under conditions which are effective to cause a recess of the conductor in the contact hole. Next, an optional barrier layer 42 is deposited by known techniques such as PVD or CVD. The optional barrier layer employed in the present invention must prevent oxygen from reaching the conductor material as well as preventing the conductor material to come in contact with the metals deposited above the barrier layer. Suitable barrier materials that may be employed in the present invention include: TaSiN, TiAlN, TiN and various silicides. Next, an electrode material 44 comprising a metal, such as Pt, Pd, Ru and metal oxides thereof, is deposited on top of either the optional barrier material or conductor by physical vapor deposition or by CVD using conditions well known in the art. The electrode material 44 is then patterned by chemical mechanical polishing. The node dielectric 30 and plate dielectric 38 materials are then deposited on top of electrode material 44 and planarized interlevel dielectric material 20 using the conditions and techniques mentioned above.

As stated above, the process of the present invention has numerous advantages compared to prior art processes. For example, compared to conventional stacked capacitors, it provides increased electrode area (30% or more) with no additional processing steps. Compared to crown capacitors, it provides a much simpler process, though with less electrode area than a crown capacitor. Additionally, the crown capacitor structure of the present invention provides a nearly planar surface for subsequent processing. Conversely, in the prior art, an additional insulator deposition and polish step are required to achieve a planar surface. Moreover, side wall spacers are required in the prior art crown capacitors, but not in the present invention.

While the invention has been particularly shown and described with respect to preferred embodiments thereof, it will be understood by those skilled in the art that the foregoing and other changes in form and details may be made therein without departing from the spirit and scope of the instant invention.

Having thus described our invention, what we claim as new, and desire to secure by Letters Patent is:

1. A process for fabricating a crown capacitor comprising the steps of:
   (a) providing a semiconductor structure comprising a semiconductor substrate, at least one wordline, at least one bitline, at least one bitline contact for connecting said bitline to said semiconductor substrate, and a planarized interlevel dielectric material, wherein said planarized interlevel dielectric material is on top of said semiconductor substrate and surrounds said bitline, said bitline contact and said wordline;
   (b) forming a contact hole in said planarized interlevel dielectric material between said wordlines to expose an area of said semiconductor substrate;
   (c) forming a trough in said planarized interlevel dielectric material at said contact hole, said trough does not extend all the way through said contact hole, wherein either step (b) or (c) tapered sidewalls are provided thereby forming a crown-shaped region in said planarized interlevel dielectric material;
   (d) depositing a bottom electrode material into said contact hole and said trough;
   (e) patterning the bottom electrode material provided in step (d) by chemical mechanical polishing;
   (f) depositing a node dielectric material on said patterned bottom electrode material;
   (g) optionally, subjecting the structure provided in step (f) to thermal oxidation under conditions effective to diffuse oxygen into said node dielectric material; and
   (h) depositing a plate electrode on said node dielectric material or said thermally oxidized node dielectric material.

2. The process of claim 1 wherein said contact hole in step (b) is formed by patterning said interlevel dielectric material by lithography and subjecting the patterned interlevel dielectric material to anisotropic etching.

3. The process of claim 2 wherein said anisotropic etching is selected from the group consisting of ion beam etching, laser ablation, plasma etching and reactive ion etching.

4. The process of claim 3 wherein said anisotropic etching is reactive ion etching.

5. The process of claim 1 wherein said contact hole provided in step (b) has a taper of from about 75 to about 89 degrees relative to said interlevel dielectric layer.

6. The process of claim 1 wherein said trough is formed by patterning the interlevel dielectric material by lithography and anisotropic etching said interlevel dielectric material.

7. The process of claim 1 wherein said tapered sidewalls is at an angle from about 75 to about 89 degrees.

8. The process of claim 1 wherein said tapered sidewalls is provided by reactive ion etching utilizing an etchant gas that contains carbon and fluorine.

9. The process of claim 8 wherein said etchant gas is $CHF_3$ or $C_4F_8$.

10. The process of claim 1 wherein said trough is recessed with either a wet etch or a dry etch prior to step (d).

11. The process of claim 10 wherein said wet etch is conducted using a chemical etchant selected from the group consisting of $H_2O_2$, chromic acid, phosphoric acid, HF and mixtures thereof.

12. The process of claim 11 wherein said chemical etchant is diluted in water or buffered prior to use.

13. The process of claim 12 wherein said chemical etchant is diluted HF or buffered HF.

14. The process of claim 10 wherein said dry etch is conducted using $CF_4$ gas.

15. The process of claim 1 wherein said bottom electrode is deposited by Low Pressure Chemical Vapor Deposition (LPCVD) at a pressure from about 10 to about 80 Pa for a period of time from about 5 to about 60 minutes.

16. The process of claim 1 wherein step (g) is conducted at a temperature of from about 600° to about 1100° C. for about 10 seconds to about 30 minutes.

17. The process of claim 1 wherein after step (e) the following additional steps are conducted prior to steps (f)–(g) depositing a noble metal to said bottom electrode material; annealing said noble metal and said bottom electrode material under conditions effective to form a compound electrode; and wet etching the compound electrode to remove unreacted noble metal.

18. The process of claim 1 wherein prior to conducting step (f) the following additional steps are performed, optionally, depositing a barrier layer on said patterned bottom electrode material; and then depositing a metal selected from the group consisting of Pt, Pd, Ru and oxides thereof on top of said optional barrier layer or on said patterned bottom electrode material.

19. The process of claim 1 wherein said bottom electrode material of step (d) is formed by partially depositing a conductor into said contact hole; patterning said conductor by dry etching under conditions effective to cause a recess in the trough; optionally, depositing a barrier layer on said patterned conductor; depositing a metal selected from the group consisting of Pt, Pd, Ru and oxides thereof on top of said optional barrier layer or on said conductor; and then conducting steps (f)–(h).

* * * * *